//(12) United States Patent
Moore et al.

(10) Patent No.: US 7,017,097 B1
(45) Date of Patent: Mar. 21, 2006

(54) SIMULTANEOUSLY DRIVING A HARDWARE DEVICE AND A SOFTWARE MODEL DURING A TEST

(75) Inventors: Michael T. Moore, Mountain View, CA (US); Victor So, San Jose, CA (US); Pankaj K. Jha, Fremont, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 437 days.

(21) Appl. No.: 10/253,960

(22) Filed: Sep. 24, 2002

(51) Int. Cl.
    *G01R 31/28* (2006.01)
(52) U.S. Cl. .................................................. 714/742
(58) Field of Classification Search ........ 714/741–742; 703/14, 22; 716/1, 4
    See application file for complete search history.

(56) References Cited

U.S. PATENT DOCUMENTS

| | | | |
|---|---|---|---|
| 4,519,078 A | 5/1985 | Komonytsky | 714/728 |
| 4,745,355 A | 5/1988 | Eichelberger et al. | 714/728 |
| 4,801,870 A | 1/1989 | Eichelberger et al. | 714/736 |
| 4,817,093 A | 3/1989 | Jacobs et al. | 714/728 |
| 5,202,889 A | 4/1993 | Aharon et al. | 714/739 |
| 5,390,194 A | 2/1995 | Mannle | 714/744 |
| 5,479,414 A | 12/1995 | Keller et al. | 714/726 |
| 5,546,562 A * | 8/1996 | Patel | 703/14 |
| 5,684,946 A | 11/1997 | Ellis et al. | 714/33 |
| 5,862,361 A | 1/1999 | Jain | 703/16 |
| 5,960,182 A | 9/1999 | Matsuoka et al. | 703/17 |
| 5,995,740 A | 11/1999 | Johnson | 703/20 |
| 6,006,022 A * | 12/1999 | Rhim et al. | 716/1 |
| 6,009,256 A | 12/1999 | Tseng et al. | 703/13 |
| 6,052,524 A * | 4/2000 | Pauna | 703/22 |
| 6,197,605 B1 * | 3/2001 | Simunic et al. | 438/14 |
| 6,212,489 B1 | 4/2001 | Klein et al. | 703/13 |
| 6,230,295 B1 | 5/2001 | Watkins | 714/742 |
| 6,289,279 B1 | 9/2001 | Ito et al. | 701/213 |
| 6,298,320 B1 | 10/2001 | Buckmaster et al. | 703/28 |
| 6,327,556 B1 | 12/2001 | Geiger et al. | 703/13 |
| 6,338,158 B1 | 1/2002 | Payne | 716/4 |
| 6,356,862 B1 | 3/2002 | Bailey | 703/16 |

* cited by examiner

*Primary Examiner*—Shelly Chase
(74) *Attorney, Agent, or Firm*—Christopher P. Maiorana, PC

(57) ABSTRACT

An apparatus generally comprising a circuit and an interface device is disclosed. The circuit may be configured to (i) generate a plurality of test signals to simultaneously stimulate a device and a model of the device during a test and (ii) receive a plurality of model signals generated by the model in response to the test signals. The interface device may be configured to receive a plurality of device signals generated by the device in response the test signals.

21 Claims, 3 Drawing Sheets

SIMULTANEOUSLY DRIVING A HARDWARE DEVICE AND A SOFTWARE MODEL DURING A TEST

FIELD OF THE INVENTION

The present invention relates to a method and/or architecture for testing hardware devices generally and, more particularly, to a method and/or apparatus for simultaneously driving a hardware device and software model during a test to enable co-verification of the hardware device against the software model.

BACKGROUND OF THE INVENTION

Software programmers have difficulty preparing code for hardware that has not yet completed a design stage. Debugging software coding for undeveloped hardware is nearly impossible to do with a high level of confidence that the debugged software will function properly on a prototype version of the hardware under development. Conventional approaches involve waiting to run tests against a hardware device (i.e., silicon) to see how the software operates. When the hardware is available, the tests are applied to the prototype silicon and the results are compared. If there are defects in the software code, much time is wasted in the development stage waiting for functional software to be developed after the hardware is ready.

A second conventional approach is to develop a hardware model (i.e., a field programmable gate array) of the hardware device under development with which code debugging tests are run before the silicon is ready. Such tests include sort tests, class tests, and tests using evaluation boards. The tests are generally developed blindly before the hardware is available. When the silicon version of the hardware is ready, the tests are applied to the silicon hardware.

A third conventional approach involves developing a software model (i.e., register transfer language (RTL) simulation) with which to run functional tests before a prototype of the silicon is ready. Functional tests are then applied when the silicon is ready. Following the functional tests, a simulation versus silicon analysis is performed to see if the silicon behaves in the same manner as the simulations and if the code written is functional with the prototype. If the test fails, debugging/comparing the results of the functional simulations and silicon operation can be time consuming and error prone.

Disadvantages of the conventional approaches include spending a considerable amount of time debugging software tests. Time elapses before the tests are sufficiently debugged to be helpful to the developer. The developer may have to wait until a hardware prototype is available before debugging the software. Waiting for the hardware presents a bottleneck in the silicon characterization process, delays product release and is a competitive disadvantage. Additionally, errors often arise in developing software simulations before hardware is available for comparison. Problems involved in comparing the results of the silicon and software result in delayed characterization and a long time to market for the development cycle. With conventional solutions, stepping through tests on both hardware and software models simultaneously is not possible. Comparing hardware tests with RTL simulations during functional verification and debug stages is slow and unwieldy and presents a bottleneck to the debug and correction process.

SUMMARY OF THE INVENTION

The present invention concerns an apparatus generally comprising a circuit and an interface device. The circuit may be configured to (i) generate a plurality of test signals to simultaneously stimulate a device and a model of the device during a test and (ii) receive a plurality of model signals generated by the model in response to the test signals. The interface device may be configured to receive a plurality of device signals generated by the device in response the test signals.

The objects, features and advantages of the present invention include providing a method and/or apparatus for simultaneously driving a hardware device and a software model to enable co-verification of the hardware device against the software model that may (i) offer significant advantages to a user in terms of ease of debugging and co-verification of the hardware device and the software model, (ii) be a dedicated register simulator model of a relevant device, (iii) include an register transfer language (RTL) code that may be used to produce the hardware device, (iv) provide an actual operation of the hardware silicon to be verified against the RTL code or an accurate model thereof and/or (v) allow a software developer to develop and test software against the register simulator model with a high degree of confidence that the software code may work on the real silicon.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
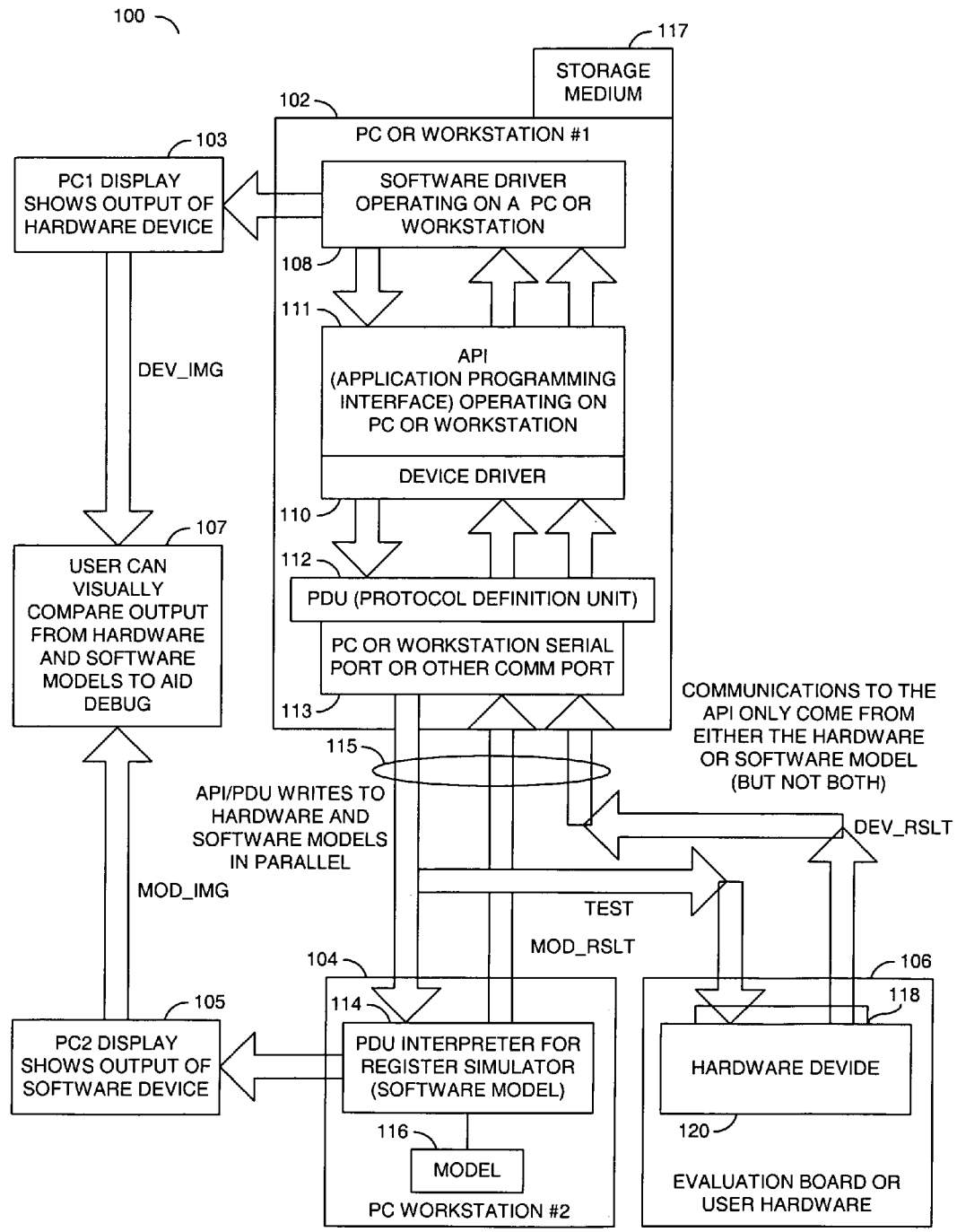
FIG. 1 is a block diagram of an apparatus in accordance with a preferred embodiment of the present invention.

Referring to FIG. 1, a block diagram of an apparatus 100 is shown in accordance with a preferred embodiment of the present invention. The apparatus 100 generally comprises a circuit 102, a circuit 103, a circuit 104, a circuit 105 and a circuit 106. The circuit 102 may be configured to present signals (e.g., TEST) simultaneously to the circuit 104 and the circuit 106. The circuit 104 may present model result signals (e.g., MOD_RSLT) back to the circuit 102 based upon the test signals TEST. The circuit 106 may present device result signals (DEV_RSLT) back to the circuit 102 based upon the test signals TEST.

The circuit 102 may be implemented as a personal computer (PC), workstation or similar computing platform. The circuit 104 may be implemented as a second PC, workstation or similar computing platform. The circuit 106 may be implemented as user hardware, an evaluation board or a similar board.

The circuit 103 may be implemented as a display coupled to the first computer 102. The circuit 103 may generate an image or signal (e.g., DEV_IMG) viewable by a user 107. The circuit 105 may be implemented as another display coupled to the second computer 104. The circuit 105 may generate an image or signal (e.g., MOD_IMG) viewable by the user.

The first computer 102 generally comprises a software program 108, a software program 110, a software program 111, a software program 112, a port circuit 113 and a storage medium 117. The software program 108 may be configured as a software driver. The software driver 108 may be executed by the first computer 102 to generate the test signals TEST, receive the device result signals DEV_RSLT (also referred to as device signals) and receive the model result signals MOD_RSLT (also referred to as model signals). The storage medium 117 may be a computer readable media suitable for storing software programs such as the software program 108, the software program 111 and the software program 112.

The software program 110 may be implemented as a device driver program. The device driver program 110 may provide access to low level registers (not shown) within the second computer 104 and the circuit 106. The device driver program 110 may also service interrupts generated by the second computer 104 and/or the circuit 106.

The software program 111 may be implemented as an application programming interface (API) program. The API program 110 may provide interface and format conversions between the software driver program 108 and the device driver program 110. The API program 108 may provide a standard or predetermined interface to the software driver program 108 generally allowing for portability of the software driver program 108 among various PCs, workstations and/or other computing resources.

The software program 112 may be implemented as a protocol definition unit (PDU) program. The PDU program 112 may provide interface and formatting conversions to send and receive data through the port circuit 113. The PDU program 112 may be arranged to drive the second computer 104 and the circuit 106 in parallel. The PDU program 112 may also be configured to receive data from the second computer 104 and/or the circuit 106.

The port circuit 113 may be implemented as one or more a communication ports. The communication port 113 may be a serial port and/or parallel port. The communication port 113 generally establishes a communications link 115 capable of transferring data to and from the second computer 104 and the circuit 106 substantially simultaneously and in parallel.

The second computer 104 generally comprises a circuit 114 and a model 116. The circuit 114 may be implemented as a PDU interpreter circuit. The PDU interpreter circuit 114 may provide translations to and from registers in the model 116. The PDU interpreter circuit 114 may be operational to execute the model 116 for simulation of the hardware device 120 operation.

The model 116 may be implemented as an ideal model of the a device being developed. The model may be implemented as a register transfer language (RTL) model (e.g., a Verilog model), a programming language model (e.g., a C model) or other type of software model of the ideal device. When implemented in software, the model 116 may be executed by the second computer 104. The model 116 may also be implemented as a hardware model. For example, one or more field programmable gate array (FPGA) circuits, a programmable logic devices (PLD), complex programmable logic devices (CPLD), and/or memory circuits may be programmed to emulate the ideal device. In one embodiment, the hardware model may be programmed with the software model.

The circuit 106 generally comprises an interface device 118 for communicating with a hardware device 120. The interface device 118 may be implemented as a socket, a set of probes, a connector and/or other device suitable for connecting to the hardware device 120. Generally, the hardware device 120 may be implemented as a hardware (e.g., silicon) implementation of the model 116. In one embodiment, the device 120 may be implemented as one or more FPGAs, PLDs, CPLDs and/or memory circuits programmed in accordance with the model 116.

During operation, the software driver program 108 may generate the test signals TEST. The test signals TEST may be useful in testing and/or debugging the hardware device 120 through a user comparison of a hardware device performance against the software model performance. The test signals TEST may flow from the software driver program 108 through the API program 111, the device driver program 110 and the PDU program 112 to the communication port circuit 113. From the communication port circuit 113, the test signals TEST may be driven simultaneously to the PDU interpreter circuit 114 and the interface device 118. The test signals TEST may thus be applied substantially simultaneously to both the model 116 and the hardware device 120.

The model result signals MOD_RSLT generated by the model 116 may be provided back to the PDU interpreter circuit 114 for conversion and transmission to the software driver program 108 and/or to the display circuit 105. The display circuit 105 may display model result signals MOD_RSLT data as the image MOD_IMG in a user friendly and understandable format such as waveforms, voltages, times, and/or the like.

The device result signals DEV_RSLT generated by the hardware device 120 may be provided through the interface device 118 back to the evaluation board 106 for conversion and transmission to the software driver program 108. The software driver program 108 may progress the device result signals DEV_RSLT into a format suitable for the display circuit 103. The display circuit 103 may display the device result signals DEV_RSLT data as the image DEV_IMG in a user friendly and understandable format such as waveforms, voltages, times and/or the like.

While viewing the images DEV_IMG and MOD_IMG, the user 107 may manually compare the output of the software model 116 against the output of the hardware device 120. The comparison may be used for debug and/or test of the software model 116. The comparison may also be used for debug and/or test of the hardware device 120 as compared with the software model 116. The visual comparison may be particularly suited to hardware device 120 and/or evaluation board 106 characterization.

In one embodiment, the model result signals MOD_RSLT may be transferred back to the software driver program 108. The software driver program 108 may convert the model result signals MOD_RSLT into a viewable format for display by the display 103. Generally, the first computer 102 may accept and process a single set of result signals at a time between the model result signals MOD_RSLT and the device result signals DEV_RSLT for display. Functionality for accepting one set of result signals and rejecting/holding the other set may be allocated to the device driver program 110. Other allocations may be made to meet a criteria of a particular application.

Figure 2:
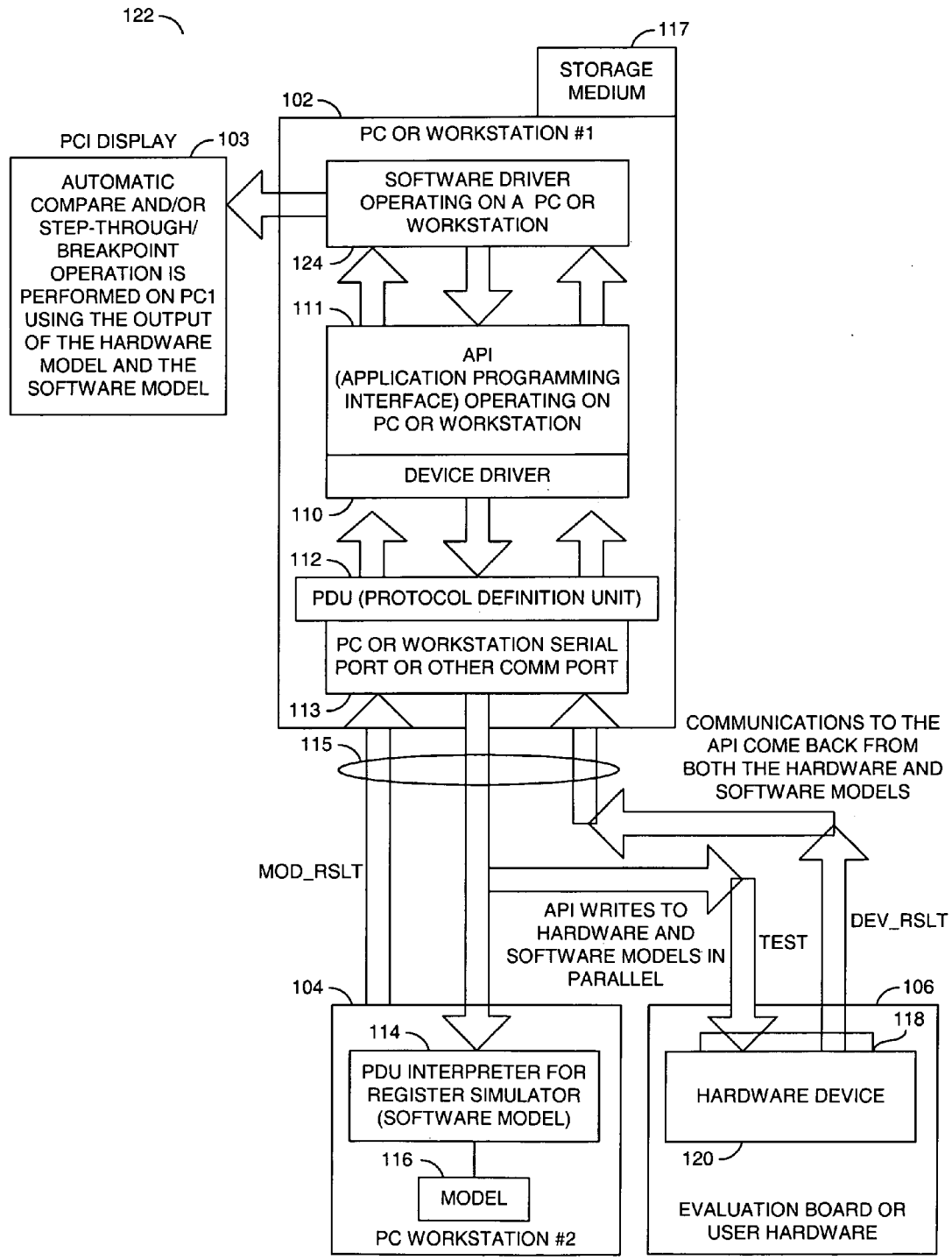
FIG. 2 is a block diagram of a second example apparatus.

Referring to FIG. 2, a block diagram of a second example apparatus 122 is shown. The apparatus 122 generally comprises a the first computer 102, the display 103, the second computer 104 the circuit 106 and the communications link 115. A software program 124 executed by the first computer 102 may be arranged to generate the test signals TEST for both the model 116 and the hardware device 120 simultaneously. The software program 124 may be implemented as a software driver program.

Bi-directional flows of information may be possible between (i) the model 116 and the software driver program 124 and (ii) the hardware device 120 and the software driver program 124. The first computer 102 may be arranged such that the user may be able to logically and/or physically switch on and off software model 116 and/or hardware device 120.

The software driver program 124 may provide automated functions useful in testing and debugging the hardware device 120 and/or the model 116. For example, the software driver program 124 may perform one or more automated comparisons of the data in the model result signals MOD_RSLT with the data in the device result signals DEV_RSLT. In another example, the software driver program 124 may generate a sequence of test vectors that may be conveyed to the model 116 and the hardware device 120 through the test signals TEST. The software driver program 124 may control stepping through the set of test vectors in realtime, semi-realtime, one step at a time, manually, and/or the like. Breakpoints operations may be included in the software driver program 124 functionality. The breakpoints may allow the test vectors to be halted so that internal states of the model 116 and/or hardware device 120 may be examined.

Figure 3:
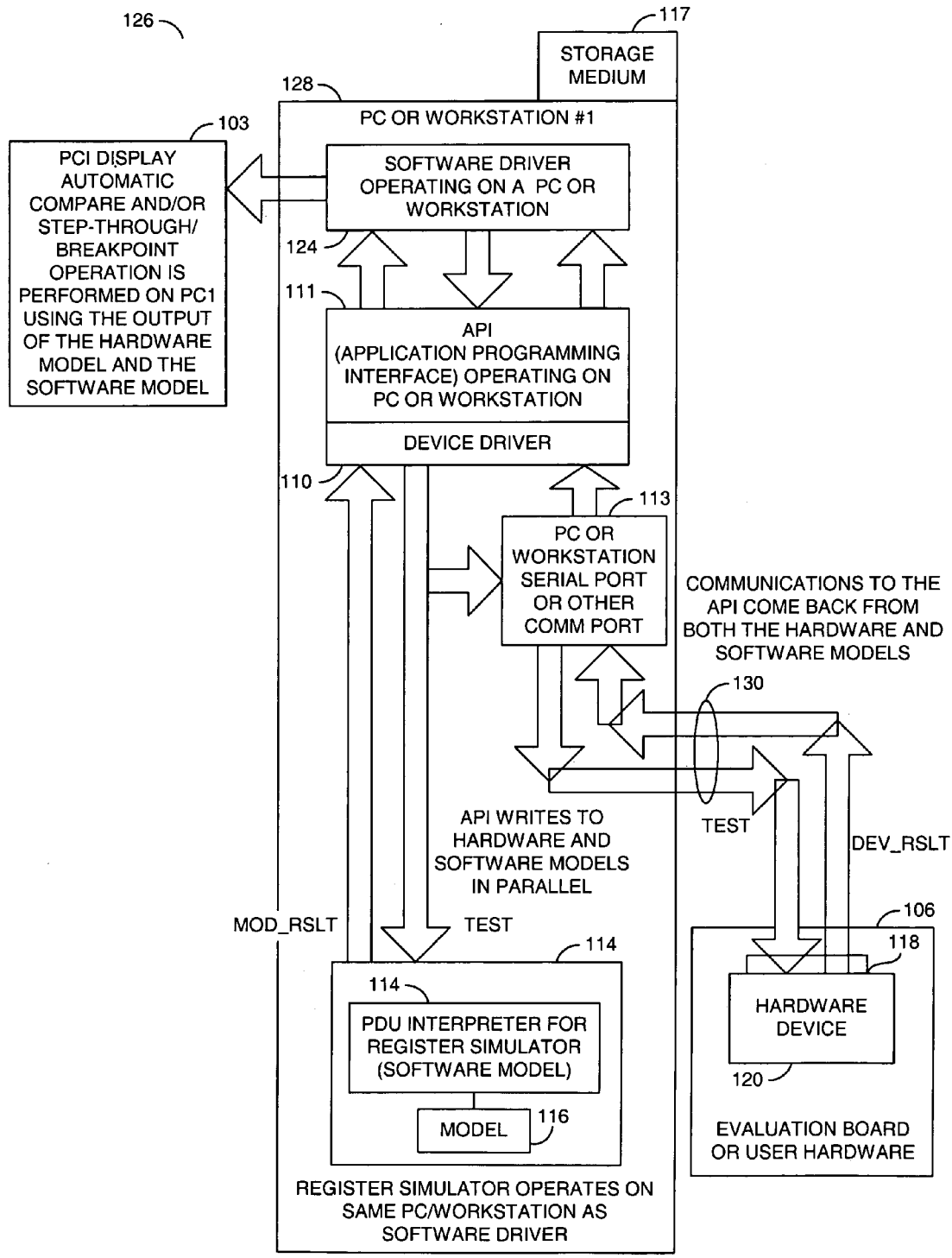
FIG. 3 is a block diagram of a third example apparatus.

Referring to FIG. 3, a block diagram of a third example apparatus 126 is shown. The apparatus 126 generally comprises a circuit 128, the display 103, the circuit 106, and a communication link 130. The circuit 128 may be implemented as a personal computer, workstation or similar computing platform. The communication link 130 may be arranged to link the computer 128 with the circuit 106. The communication link 130 generally carries the test signals TEST and the device result signals DEV_RSLT.

The computer 128 generally comprises the software driver program 124, the device driver program 110, the API program 111, the port circuit 113, the PDU interpreter circuit 114, the model 116 and the storage medium 117. The software driver program 124 may be executed by the computer 128 to both drive and read from the API program 111 for both the PDU interpreter circuit 114 and the actual hardware device 120. Bi-directional flows of information may be possible between the software model 116 and hardware model 120 and the software driver program 110. The user may be able to switch on and off (e.g., enable and disable) the software model 116 and/or hardware device model 120 at will.

The present invention may offer the user a feature allowing code testing on both real silicon versions of the hardware (e.g., evaluation board or other developmental prototype) and the software model in parallel. The parallel operation may offer the user a significant degree of confidence that the code developed on the model (before a prototype arrives) may work the same way on the silicon once fabricated. The parallel operation may also offer the user a significant time to market advantage in a development process for the silicon. Alternatively, an implementation using the device RTL synthesized to a programmable logic (e.g., a field programmable gate array) may be used instead of either the hardware device 120 and/or the model 116. In one example, a user/developer may be provided with an evaluation board comprising a field programmable gate array programmed with the (possibly encrypted) RTL of a device, which may be used to test code before the silicon prototype becomes available.

Providing users and developers with the opportunity to test code on both software RTL simulated versions of the hardware under development and physical electronics in parallel may allow the users/developers to identify errors in software and/or hardware models, remedy errors, and have functional code ready for the silicon version of the hardware under development once ready. The redundancy of testing software and hardware designs in parallel may allow for a high degree of confidence that the developed code may be functional and that the hardware and software prototypes may be valid.

The present invention may include a computer product which may be a storage medium including instructions which can be used to program a computer to perform a process in accordance with the present invention. The storage medium can include, but may not be limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

Portions of the present invention may also be implemented by the preparation of ASICs, FPGAs, CPLDs, PLDs or by interconnecting an appropriate network of conventional component circuits, as is described herein, modifications of which will be readily apparent to those skilled in the art(s). As used herein, the term "simultaneously" is meant to describe events that share some common time period but the term is not meant to be limited to events that begin at the same point in time, end at the same point in time, or have the same duration.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
a circuit configured to (i) generate a plurality of test signals that substantially simultaneously stimulate a device and a model of said device during a test and (ii) receive a plurality of model signals generated by said model responding to said test signals; and
an interface device (i) remote from said circuit and (ii) configured to receive a plurality of device signals generated by said device responding said test signals, wherein said model consists one of (i) a-programmable logic device and (ii) a complex programmable logic device.

2. The apparatus according to claim 1, wherein said circuit comprises a first computer configured to generate said test signals.

3. The apparatus according to claim 2, wherein said circuit further comprises a second computer configured to execute said model.

4. The apparatus according to claim 3, further comprising a communication link configured to transfer said model signals from said second computer to said first computer.

5. The apparatus according to claim 4, wherein said communication link is further configured to (i) transfer said test signals from said first computer to both said second computer and said interface device and (ii) transfer said device results from said interface device to said first computer.

6. The apparatus according to claim 1, further comprising a first display configured to generate a first image displaying data from said device signals.

7. The apparatus according to claim 6, further comprising a second display configured to generate a second image displaying data from said model signals.

8. The apparatus according to claim 1, wherein said circuit further comprises a program configured to transmit said test signals to both said device and said model substantially simultaneously.

9. The apparatus according to claim 8, wherein said program is further configured to accept only one of (i) said device signals and (ii) said model signals.

10. The apparatus according to claim 8, wherein said program is further configured to substantially simultaneously accept both (i) said device signals and (ii) said model signals.

11. The apparatus according to claim 1, further comprising a board (i) directly connected to said interface device and (ii) configured to provide communication between said interface device and said circuit.

12. The apparatus according to claim 1, wherein said model consists one of (i) a programmable logic device and (ii) a complex programmable logic device.

13. The apparatus according to claim 1, wherein said circuit is further configured to execute said model.

14. A method of performing a test, comprising the steps of:
   (A) generating a plurality of test signals that substantially simultaneously stimulate a device and a model of said device during said test;
   (B) receiving a plurality of device signals generated by said device responding to said test signals;
   (C) receiving a plurality of model signals generated by said model responding to said test signals;
   (D) generating a first image displaying data from said device signals; and
   (E) generating a second image displaying data from said model signals.

15. The method according to claim 14, further comprising the step of displaying an image of data from only one of said device signals and said device signals.

16. The method according to claim 14, further comprising the step of displaying an image of data from both said model signals and said model signals.

17. The method according to claim 14, further comprising the step of automatically comparing device data from said device signals with model data from said model signals.

18. The method according to claim 14, further comprising the step of stepping through a plurality of test vectors within said test signals manually.

19. The method according to claim 18, further comprising the step of halting said test vectors in response to a breakpoint.

20. The method according to claim 14, further comprising a storage medium recording a computer program comprising the steps of claim 14.

21. An apparatus comprising:
   a circuit configured to (i) generate a plurality of test signals that substantially simultaneously stimulate a device and a model of said device during a test and (ii) receive a plurality of model signals generated by said model responding to said test signals;
   an interface device (i) remote from said circuit and (ii) configured to receive a plurality of device signals generated by said device responding said test signals;
   a first display configured to generate a first image displaying data from said device signals; and
   a second display configured to generate a second image displaying data from said model signals.

* * * * *